(12) United States Patent
Shibamoto et al.

(10) Patent No.: US 10,447,236 B2
(45) Date of Patent: Oct. 15, 2019

(54) ULTRASONIC PROBE

(71) Applicant: TOSHIBA MEDICAL SYSTEMS CORPORATION, Otawara-Shi (JP)

(72) Inventors: Koichi Shibamoto, Otawara (JP); Yasuhisa Makita, Nasushiobara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 413 days.

(21) Appl. No.: 15/273,096

(22) Filed: Sep. 22, 2016

(65) Prior Publication Data

US 2017/0165716 A1    Jun. 15, 2017

(30) Foreign Application Priority Data

Dec. 11, 2015   (JP) .................................. 2015-241745
Jul. 19, 2016   (JP) .................................. 2016-141408

(51) Int. Cl.
*H03H 9/205*     (2006.01)
*B06B 1/06*      (2006.01)

(52) U.S. Cl.
CPC .......... *H03H 9/205* (2013.01); *B06B 1/0622* (2013.01)

(58) Field of Classification Search
CPC .................................................... H03H 9/205
USPC ................................ 310/334, 358, 335, 337
See application file for complete search history.

(56) References Cited

U.S. PATENT DOCUMENTS

| 5,435,313 | A | * | 7/1995 | Noda | B06B 1/0622 600/459 |
| 7,598,658 | B2 | * | 10/2009 | Takeuchi | B06B 1/0622 310/334 |
| 8,604,671 | B2 | * | 12/2013 | Shikata | B06B 1/0629 310/334 |

FOREIGN PATENT DOCUMENTS

| JP | 2010278766 | * 9/2010 | ............. H04R 17/00 |
| JP | 2010-278766 | 12/2010 | |

* cited by examiner

*Primary Examiner* — Thomas M Dougherty
*Assistant Examiner* — Karen B Addison
(74) *Attorney, Agent, or Firm* — Oblon, McClelland, Maier & Neustadt, L.L.P.

(57) ABSTRACT

According to one embodiment, an ultrasonic probe, in which a plurality of piezoelectric vibrators are arrayed in both of an azimuth direction and an elevation direction, includes a piezoelectric body configured to have a piezoelectric effect; and a matching layer configured to be laminated in an ultrasonic radiation direction of the piezoelectric body. The matching layer is divided in the azimuth direction without being divided in the elevation direction. The piezoelectric body is divided into plural parts in both of the azimuth direction and the elevation direction in such a manner that each of the plural parts of the piezoelectric body forms each of the plurality of piezoelectric vibrators.

3 Claims, 8 Drawing Sheets

ULTRASONIC PROBE

CROSS-REFERENCE TO RELATED APPLICATIONS

This application is based upon and claims the benefit of priority from Japanese Patent Application No. 2015-241745, filed on Dec. 11, 2015 and Japanese Patent Application No. 2016-141408 filed on Jul. 19, 2016, the entire contents of each of which are incorporated herein by reference.

FIELD

Embodiments described herein relate generally to an ultrasonic probe.

BACKGROUND

An ultrasonic diagnostic apparatus is known as one of medical image diagnostic apparatuses, and is configured to scan inside of an object's body by using an ultrasonic wave and to image an internal state of the object based on a received signal generated from a reflective wave reflected from the inside of the object's body. An ultrasonic diagnostic apparatus transmits an ultrasonic wave from an ultrasonic probe to the inside of the object's body. Then, the ultrasonic diagnostic apparatus receives a reflected wave generated due to mismatch of acoustic impedance inside the object's body (i.e., difference in acoustic impedance between respective discontinuous planes where the ultrasonic wave is reflected), and generates a received signal based on the reflected wave.

Additionally, an ultrasonic probe is equipped with plural piezoelectric vibrators regularly arrayed in a scanning direction. Each piezoelectric vibrator vibrates based on a transmission signal so as to generate an ultrasonic wave, and generates a received signal by receiving a reflected signal.

Here, an ultrasonic probe in which piezoelectric vibrators are arrayed in both of the first array direction (i.e., the azimuth direction) and the second array direction (i.e., the elevation direction) perpendicular to the first array direction like a matrix has been developed. For instance, a ultrasonic probe equipped with piezoelectric vibrators of 1.5D array type is known. In a scanning operation, an ultrasonic probe of this 1.5D array type can electronically control the piezoelectric vibrators not only in the azimuth direction but also in the elevation direction, and can form a more ideal acoustic field where ultrasonic waves are transmitted and received.

A general ultrasonic probe is configured of, e.g., a piezoelectric body, an electrode layer for applying voltage to the surface of the piezoelectric body, a flexible printed circuit for extracting signals from the electrode layer by wire in an ultrasonic radiation direction of the piezoelectric body, and an acoustic matching layer.

However, in the case of, e.g., an ultrasonic probe equipped with piezoelectric vibrators of 1.5D array type, strength of each piezoelectric vibrator decreases if size of each piezoelectric vibrator becomes fine, and there are concerns of manufacturing failure and decrease in reliability.

DETAILED DESCRIPTION

According to one embodiment, an ultrasonic probe, in which a plurality of piezoelectric vibrators are arrayed in both of an azimuth direction and an elevation direction, includes: a piezoelectric body configured to have a piezoelectric effect; and a matching layer configured to be laminated in an ultrasonic radiation direction of the piezoelectric body, wherein the matching layer is divided in the azimuth direction without being divided in the elevation direction; and the piezoelectric body is divided into plural parts in both of the azimuth direction and the elevation direction in such a manner that each of the plural parts of the piezoelectric body forms each of the plurality of piezoelectric vibrators.

Hereinafter, embodiments of an ultrasonic probe will be described with reference to the accompanying drawings.

First Embodiment

Figure 1:
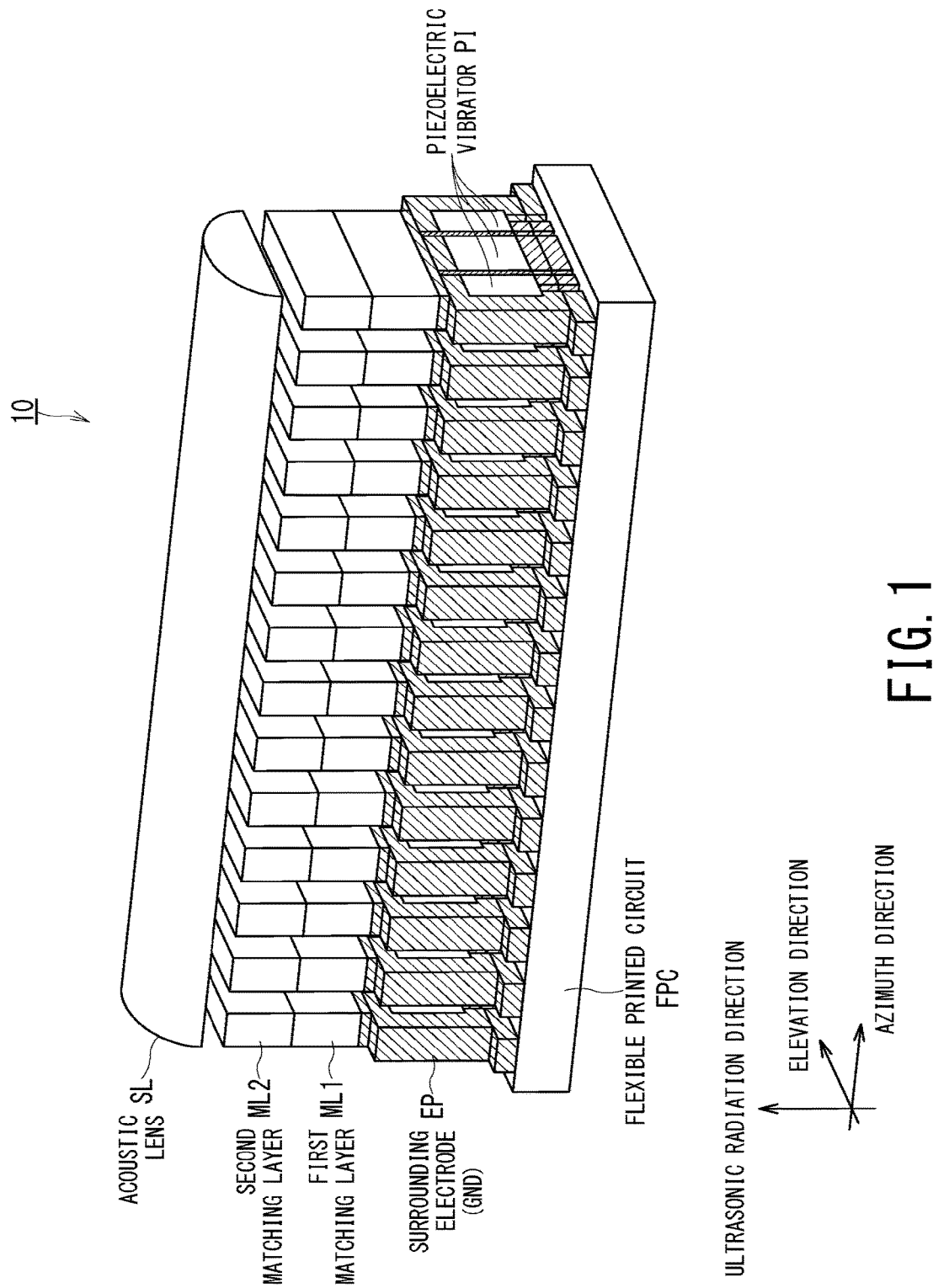
FIG. 1 is a schematic perspective view illustrating overall configuration of the ultrasonic probe of the first embodiment.

FIG. 1 is a schematic perspective view illustrating overall configuration of an ultrasonic probe 10 of the first embodiment.

As shown in FIG. 1, the ultrasonic probe 10 of the first embodiment includes a flexible printed circuit (flexible circuit board) FPC, 42 piezoelectric vibrators PI, 14 surrounding electrodes EP, the first matching layer ML1, the second matching layer ML2, and an acoustic lens SL.

The flexible printed circuit FPC separately extracts respective signals of the plural piezoelectric vibrators PI, and forms the common ground on the surface of each of the piezoelectric vibrators PI, and forms the common ground on the surface of each of the piezoelectric vibrators PI. Note that the common ground is formed together with the surrounding electrodes EP to be described below.

Each of the plural piezoelectric vibrators PI is configured of an elongated vibrator, and many piezoelectric vibrators PI are arrayed like teeth of a comb so as to form vibrator groups. Each of the piezoelectric vibrators PI has, e.g., a piezoelectric effect by which conversion between voltage and sound is enabled.

Although a piezoelectric body (i.e., piezoelectric material) is divided as a 1.5D array into 14 columns in the azimuth direction and 3 rows in the elevation direction so as to form a total of 42 piezoelectric vibrators PI in FIG. 1, this is only one case for providing easy recognition of configuration of the ultrasonic probe 10. Embodiments of the present invention are not limited to the above-described case. Actually, more piezoelectric vibrators PI (e.g., 128 to 256 piezoelectric vibrators PI) are arrayed in the azimuth direction.

In the present embodiment, out of the two-dimensional array directions of the piezoelectric vibrators PI, one is defined as the azimuth direction and the other is defined as the elevation direction. The azimuth direction is the direction along which 14 piezoelectric vibrators PI are laterally arrayed on the paper face of FIG. 1. The elevation direction is the direction perpendicular to the azimuth direction, and 3 piezoelectric vibrators PI are arrayed along the elevation direction. Further, the direction from the array plane of the piezoelectric vibrators PI to the acoustic lens SL (i.e., the direction perpendicular to both of the azimuth direction and the elevation direction) is referred to as the ultrasonic radiation direction.

Each of the surrounding electrodes EP is a ground electrode common to three piezoelectric vibrators PI arrayed along the elevation direction, and extends from the top surfaces to the side surfaces and bottom surfaces of the three piezoelectric vibrators PI so as to almost cover each of the piezoelectric vibrators PI. In other words, the ground electrode is formed around three piezoelectric vibrators PI arrayed along the elevation direction, so as to circle around the three piezoelectric vibrators PI within the plane which is in parallel with the ultrasonic radiation direction and the elevation direction. Details of the shape of the surrounding electrode EP will be described below.

Each of the first matching layer ML1 and the second matching layer ML2 is an acoustic matching layer for matching between a biological body and the piezoelectric vibrators PI.

The acoustic lens SL is configured by forming material inside which acoustic velocity is slower than inside of a biological body into a lenticular shape, in order to focus an ultrasonic beam in the ultrasonic radiation direction. The acoustic lens SL is integrally attached to the anterior surfaces of the respective piezoelectric vibrators PI. The acoustic lens SL generates an ultrasonic beam which is narrow as a whole, by focusing an ultrasonic beam.

Incidentally, the ultrasonic probe 10 of the present embodiment targets an ultrasonic probe in which piezoelectric vibrators are two-dimensionally arrayed along both of the azimuth direction and the elevation direction. Although the ultrasonic probe 10 is configured by arraying piezoelectric vibrators as a 1.5D array type in the first embodiment, embodiments of the present invention is not limited to such an aspect. For instance, the ultrasonic probe 10 may be configured as a 2D array type.

Hereinafter, details of the ultrasonic probe 10 of the first embodiment will be described.

Figure 2:
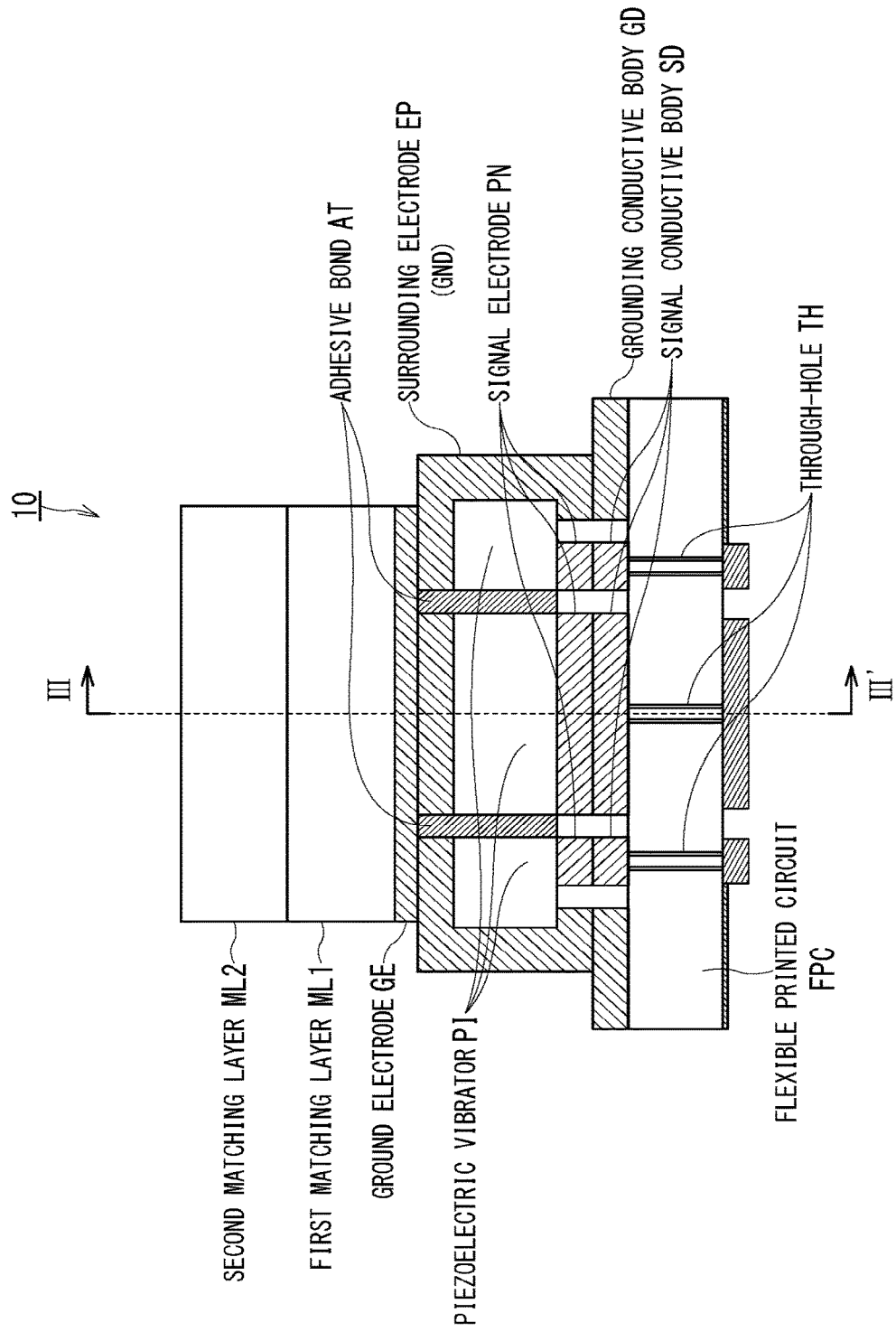
FIG. 2 is a schematic cross-sectional view illustrating the ultrasonic probe of the first embodiment, when viewed from the azimuth direction.
Figure 3:
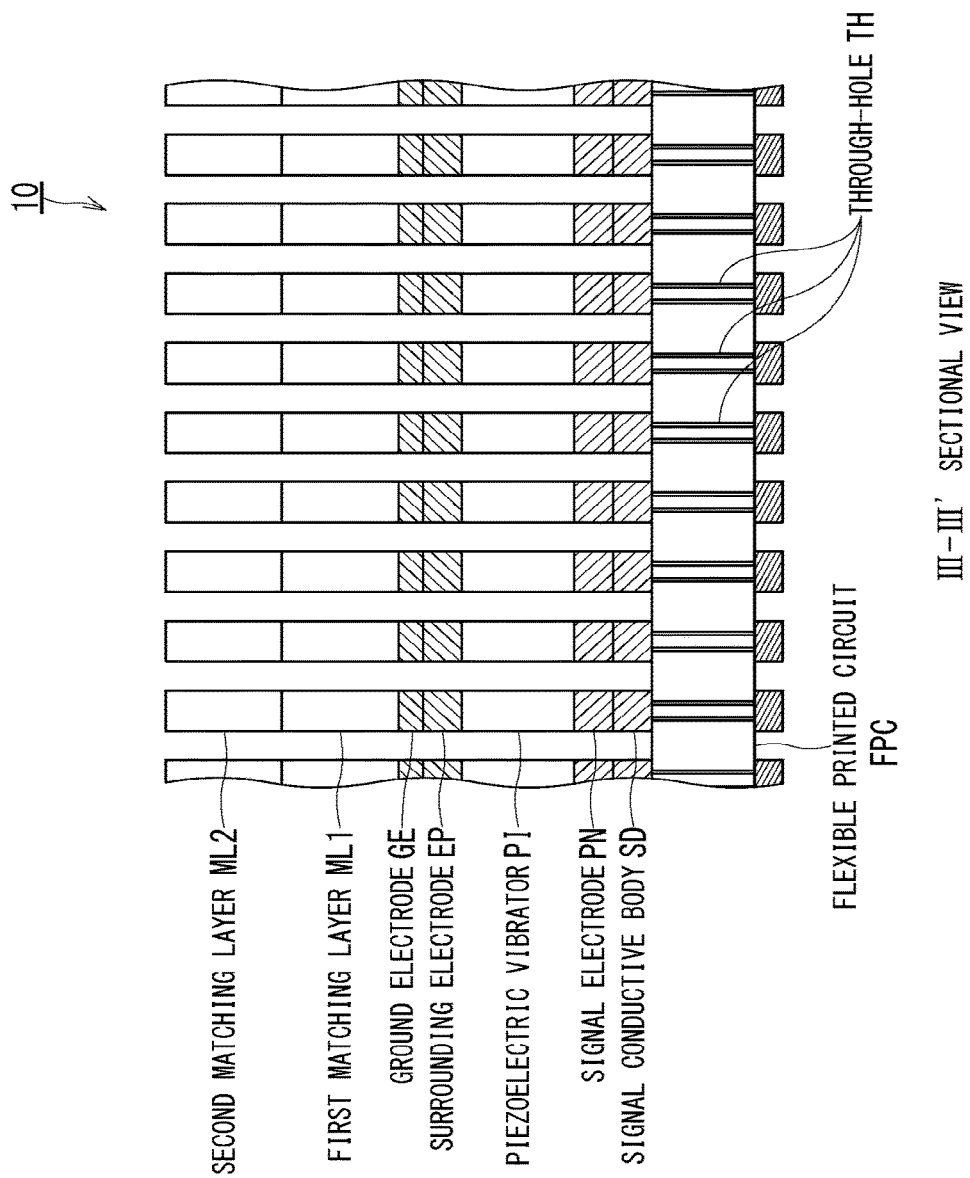
FIG. 3 is a schematic cross-sectional view through line of FIG. 2 illustrating the ultrasonic probe of the first embodiment when viewed from the elevation direction.

FIG. 2 is a schematic cross-sectional view illustrating the ultrasonic probe 10 of the first embodiment, when viewed from the azimuth direction. Additionally, FIG. 3 is a schematic cross-sectional view through line of FIG. 2 illustrating the ultrasonic probe 10 of the first embodiment, when viewed from the elevation direction. Incidentally, the acoustic lens SL is omitted in FIG. 2 and FIG. 3 for avoiding complication in the multilayered structure.

As shown in FIG. 2, the ultrasonic probe 10 of the first embodiment includes a flexible printed circuit FPC, the plural piezoelectric vibrators PI, the surrounding electrodes EP, the first matching layer ML1, and the second matching layer ML2. Each of the plural piezoelectric vibrators PI includes a signal electrode PN on the bottom surface (i.e., on the side of the flexible printed circuit FPC).

When voltage is applied to each of the piezoelectric vibrators PI from the corresponding signal electrode PN in an ultrasonic transmission operation, each of the piezoelectric vibrators PI generates an ultrasonic signal by a piezoelectric effect in accordance with a voltage value between the signal electrode PN and the surrounding electrode EP which is the ground electrode.

In an ultrasonic reception operation, a received ultrasonic signal is applied to each of the piezoelectric vibrators PI and voltage in accordance with the intensity of the received ultrasonic signal is generated between the signal electrode PN and the surrounding electrode EP which is the ground electrode.

In the present embodiment, the ultrasonic probe 10 is formed by dividing the piezoelectric body into plural parts corresponding to the respective piezoelectric vibrators PI. As one case of possible embodiments, a description will be given of a case where the ultrasonic probe 10 is equipped with piezoelectric vibrators of 1.5 array type, and it is assumed that three piezoelectric vibrators PI are arrayed in the elevation direction.

Additionally, as shown in FIG. 2 and FIG. 3, the first matching layer ML1 and the second matching layer ML2 are laminated on the top surfaces of the respective piezoelectric vibrators PI (i.e., on the surfaces on the ultrasonic radiation direction side).

In the present embodiment, each of the first matching layer ML1 and the second matching layer ML2 is divided into plural parts in the azimuth direction without being divided in the elevation direction. Further, the piezoelectric body is divided in both of the azimuth direction and the elevation direction into a total of 42 parts which form the 42 piezoelectric vibrators PI.

Due to the above-described configuration of the ultrasonic probe 10 in the first embodiment, strength of each of the piezoelectric vibrators PI is maintained and high quality of the ultrasonic probe 10 can be maintained, even if each of the piezoelectric vibrators PI is miniaturized. This is because the first matching layer ML1 and the second matching layer ML2 are not divided in the elevation direction. Since high quality of the ultrasonic probe 10 can be kept, high reliability of the ultrasonic probe 10 can be maintained.

Incidentally, a ground electrode GE is provided between the surrounding electrode EP and the first matching layer ML1, so that the surrounding electrode EP can be grounded even if the first matching layer ML1 is formed by a non-conductive material. Since the ground electrode GE is connected to each of the surrounding electrodes EP, the first matching layer ML1 and the plural piezoelectric vibrators PI can be grounded to a reference potential. For instance, when the first matching layer ML1 is formed by a conductive material, it is not necessary to provide the ground electrode GE.

In order to clarify the difference between the first embodiment and a conventional technology, configuration of a conventional ultrasonic probe 10A will be described.

Figure 4:
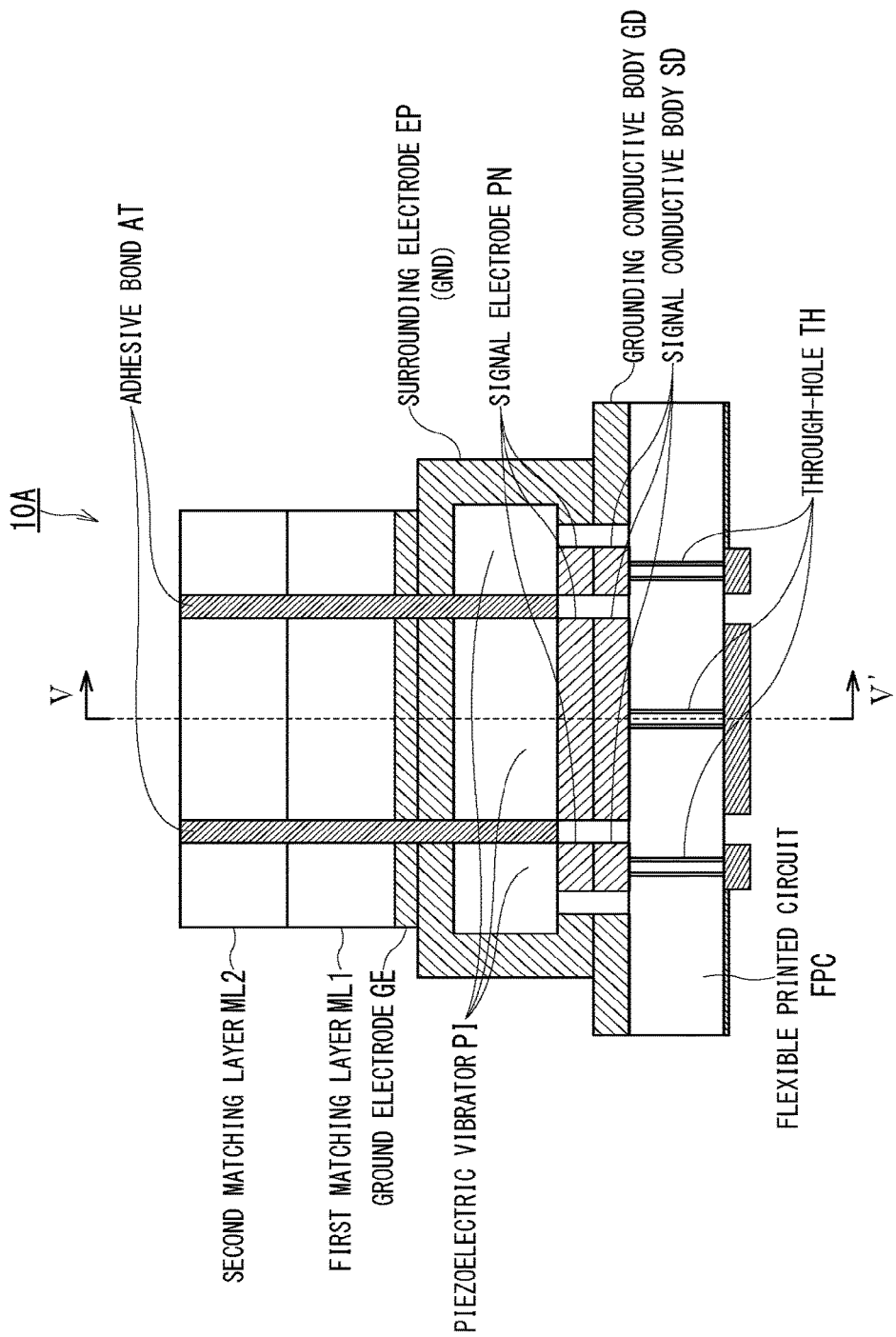
FIG. 4 a schematic cross-sectional view illustrating a conventional ultrasonic probe, when viewed from the azimuth direction.
Figure 5:
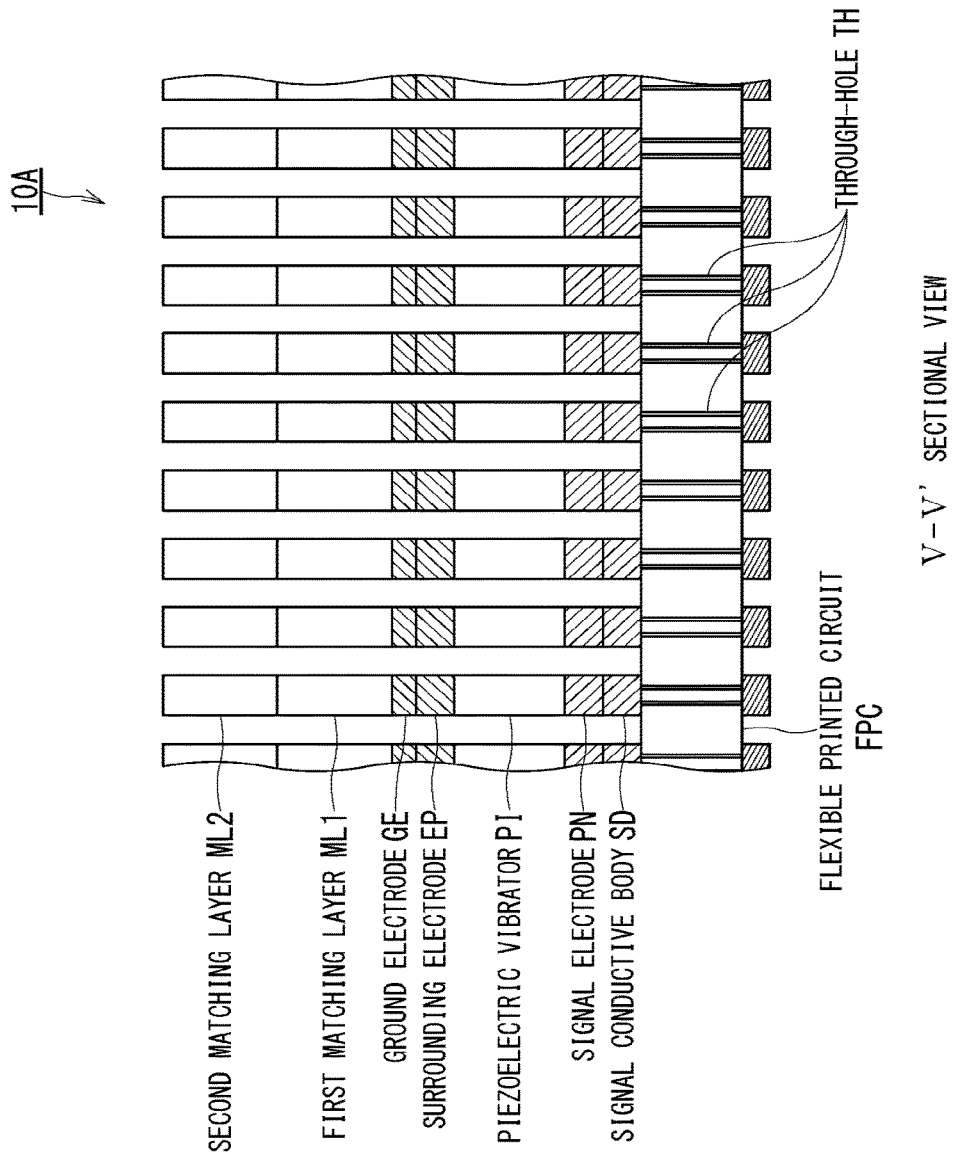
FIG. 5 is a schematic cross-sectional view through line V-V' of FIG. 4 illustrating the conventional ultrasonic probe when viewed from the elevation direction.

FIG. 4 is a schematic cross-sectional view illustrating the conventional ultrasonic probe 10A, when viewed from the azimuth direction. FIG. 5 is a schematic cross-sectional view through line V-V' of FIG. 4 illustrating the conventional ultrasonic probe 10A, when viewed from the elevation direction.

As shown in FIG. 4, the conventional ultrasonic probe 10A is different from the ultrasonic probe 10 shown in FIG. 2 in that both of the first matching layer ML1 and the second matching layer ML2 are divided in the elevation direction (i.e., the lateral direction on the paper face of FIG. 4). In the conventional ultrasonic probe 10A, the two grooves separating the first matching layer ML1 into three parts in the elevation direction are filled with adhesive bond AT by which the three parts of the first matching layer are bonded to each other in the elevation direction, and the same applies to the second matching layer ML2. However, it is estimated that strength of piezoelectric vibrators is reduced because of dividing the first matching layer ML1 and the second matching layer ML2 in the elevation direction Contrastively, in the ultrasonic probe 10 of the first embodiment shown in FIG. 2, the first matching layer ML1 and the second matching layer ML2 are not divided in the elevation direction. Accordingly, in the first embodiment, strength of each piezoelectric vibrator is not reduced but sufficiently strongly maintained, and thus high quality of the ultrasonic probe 10 can be maintained. Additionally, since a process of dividing the first matching layer ML1 and the second matching layer ML2 in the elevation direction as well as the adhesive bond AT can be omitted from the entire manufacturing process of the ultrasonic probe 10, the first embodiment is advantageous over conventional technology in terms of manufacturing process and manufacturing cost.

FIG. 5 is a schematic cross-sectional view through line V-V' of FIG. 4 illustrating the conventional ultrasonic probe 10A, when viewed from the elevation direction.

FIG. 5 indicates that the cross-sectional view through line V-V' of the conventional ultrasonic probe 10A is the same as the cross-sectional view through line of the ultrasonic probe 10 of the first embodiment shown in FIG. 3.

In other words, the manufacturing process of the ultrasonic probe 10 of the first embodiment is almost the same as the conventional ultrasonic probe 10A except the above-described different points. Specifically, almost the same manufacturing process as the conventional ultrasonic probe 10A can be applied to the ultrasonic probe 10 of the first embodiment, except that a process of dividing the first matching layer ML1 and the second matching layer ML2 in the elevation direction is omitted in the first embodiment.

Since element size in the elevation direction is larger than element size in the azimuth direction in the ultrasonic probe 10, an acoustic crosstalk effect due to the above-described structure in which the first matching layer ML1 and the second matching layer ML2 are not divided in the elevation direction is sufficiently negligible.

Next, the flexible printed circuit FPC and the surrounding electrode EP will be described.

As shown in FIG. 2 and FIG. 3, the ultrasonic probe 10 is provided with the flexible printed circuit FPC which separately extracts signals of the respective piezoelectric vibrators PI.

As described above, each of the surrounding electrodes EP is formed around three piezoelectric vibrators PI arrayed along the elevation direction. Additionally, three signal electrodes PN connected to the respective three piezoelectric vibrators PI arrayed along the elevation direction are formed on the bottom surface (i.e., the side opposite to the ground electrode GN) of the respective piezoelectric vibrators PI.

The surrounding electrode EP functions as the common ground (GND) as a whole. In other words, each of the surrounding electrode EP forms an electrode layer functioning as the common ground (GND) so as to cover or circle around three piezoelectric vibrators PI arrayed along the elevation direction within the plane in parallel with the ultrasonic radiation direction and the elevation direction. Note that the elevation direction is the lateral direction on the paper surface of FIG. 2 and the ultrasonic radiation direction is the longitudinal direction on the paper surface of FIG. 2.

In the present embodiment, the ultrasonic prove 10 includes a total of 14 surrounding electrodes EP which are arrayed in the azimuth direction as shown in FIG. 1.

Further, the flexible printed circuit FPC is provided on the bottom surface side of each of the piezoelectric vibrators PI which is opposite to the ultrasonic radiation direction side.

Figure 6A:
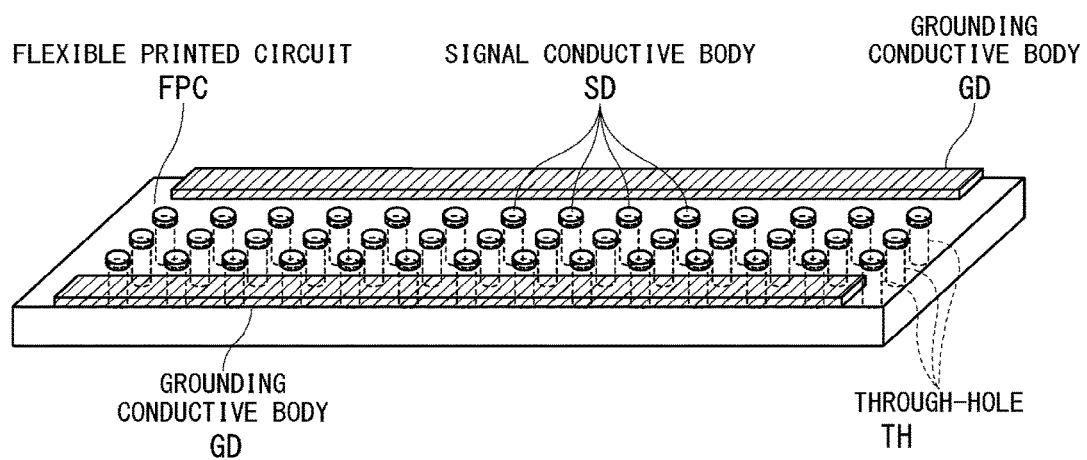
FIG. 6A and FIG. 6B are perspective views illustrating the flexible printed circuit FPC used for the ultrasonic probe of the first embodiment.
Figure 6B:
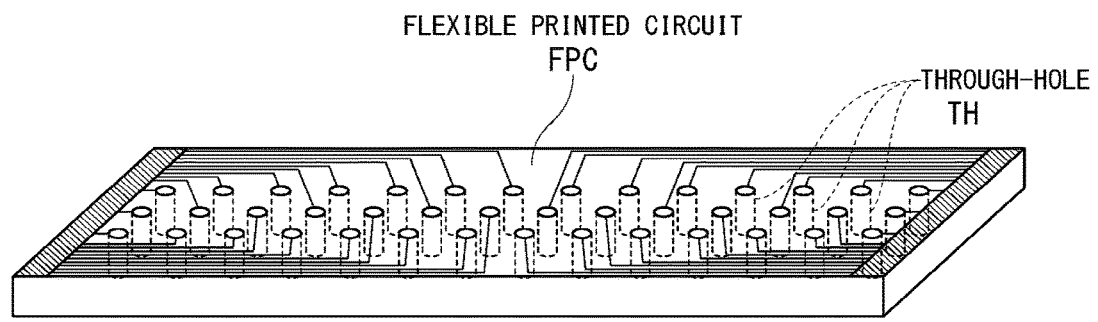

FIG. 6A and FIG. 6B are perspective views illustrating the flexible printed circuit FPC used for the ultrasonic probe 10 of the first embodiment.

FIG. 6A illustrates the anterior surface of the flexible printed circuit FPC, i.e., the surface on the ultrasonic radiation direction side. Additionally, FIG. 6B illustrates the reverse surface of the flexible printed circuit FPC.

In FIG. 6A and FIG. 6B, a total of 42 holes penetrating through the flexible printed circuit FPC in the ultrasonic radiation direction indicates 42 through-holes TH. In FIG. 6A, two hatched regions indicate respective patterns of the two grounding conductive bodies GD connected to ends of the respective surrounding electrodes EP each of which covers a set of three piezoelectric vibrators PI arrayed along the elevation direction. Additionally, in FIG. 6B, the hatched regions indicate connection points of signal lines. Specifically, 42 signal lines of extracting signals of the respective 42 piezoelectric vibrators PI via the 42 through-holes TH are wired on the reverse surface of the flexible printed circuit FPC so that those 42 signals are separately extracted.

In other words, the flexible printed circuit FPC is provided with the 42 through-holes TH penetrating the flexible printed circuit FPC from its anterior surface where the piezoelectric vibrators PI are formed to its reverse surface. Additionally, both ends (i.e., one end and the opposite end in the elevation direction) of the bottom surface of each of the 14 surrounding electrodes EP as the common ground are connected to the two grounding conductive bodies GD, respectively.

Further, 42 signal lines connected to the respective signal electrodes PN of the 42 piezoelectric vibrators PI extend to the reverse surface side of the flexible printed circuit FPC via those 42 through holes, and are wired on this reverse surface. By adopting such configuration, the flexible printed circuit FPC is integrally bonded (connected) to the respective piezoelectric vibrators PI.

As described above, the two grounding conductive bodies GD connected to the 14 surrounding electrodes EP and 42 signal conductive bodies SD respectively connected to the 42 signal electrode PN are formed on the anterior surface of the flexible printed circuit FPC, and thereby, the flexible printed circuit FPC is integrally bonded (connected) to the respective 42 piezoelectric vibrators PI. Further, 42 signal lines connected to the respective 42 signal electrodes PN extend to the reverse surface of the flexible printed circuit FPC via the 42 through-holes TH, and are wired on this reverse surface.

Thus, the ultrasonic probe 10 of the first embodiment can separately extract signals of the respective piezoelectric vibrators PI via the respective through-holes TH, and can form the surrounding electrodes EP as the common ground on the anterior surface of the flexible printed circuit FPC where the piezoelectric vibrators PI are formed.

As described above, the first matching layer ML1 and the second matching layer ML2 are not divided in the elevation direction, which enables the ultrasonic probe 10 of the first embodiment to maintain strength of each piezoelectric vibrator PI even if each piezoelectric vibrator PI is miniaturized. Accordingly, high quality of the ultrasonic probe 10 can be maintained even if each piezoelectric vibrator PI is miniaturized. Since high quality of the ultrasonic probe 10 can be maintained, high reliability of the ultrasonic probe 10 is maintained.

Additionally, the two grounding conductive bodies GD connected to the surrounding electrodes EP as well as the 42 signal conductive bodies SD connected to the respective signal electrodes PN are formed on the same (i.e., anterior) surface of the flexible printed circuit FPC of the ultrasonic probe 10 of the first embodiment, so that the flexible printed circuit FPC is integrally bonded (connected) to the 42 piezoelectric vibrators PI. Further, the signal lines connected to the respective signal electrodes PN penetrate the flexible printed circuit FPC via the through-holes TH, and are wired on the reverse surface of the flexible printed circuit FPC.

Thus, in the ultrasonic probe 10, structural complication of the flexible printed circuit FPC can be avoided, and degree of freedom in wiring can be improved by wiring the signal lines on the reverse side of the flexible printed circuit FPC.

Note that the configuration of the first embodiment in which the piezoelectric vibrators PI, the surrounding electrodes EP, and the flexible printed circuit FPC shown in FIG. 6A are integrally (collectively) bonded to each other is not disclosed in conventional technology. This configuration of the first embodiment has advantageous effects.

Accordingly, only the structural part of the ultrasonic probe 10 of the first embodiment shown in FIG. 1 may be manufactured independently from peripheral components in an ultrasonic diagnostic apparatus by adopting the above-described configuration in which the piezoelectric vibrators PI, the surrounding electrodes EP, and the flexible printed circuit FPC shown in FIG. 6A are integrally bonded to each other.

In other words, whether the piezoelectric vibrators PI are separated from the first matching layer ML1 and the second matching layer ML2 or not, the configuration in which the surrounding electrodes EP, and the flexible printed circuit FPC shown in FIG. 6A are integrally bonded to each other can be applied to the ultrasonic probe 10 of the first embodiment.

Thus, in the ultrasonic probe 10, structural complication of the flexible printed circuit FPC can be avoided, and degree of freedom in wiring can be improved by wiring the signal lines on the reverse side of the flexible printed circuit FPC.

Second Embodiment

The ultrasonic probe 10 of the second embodiment further includes backing material in addition to components of the ultrasonic probe 10 of the first embodiment.

Figure 7:
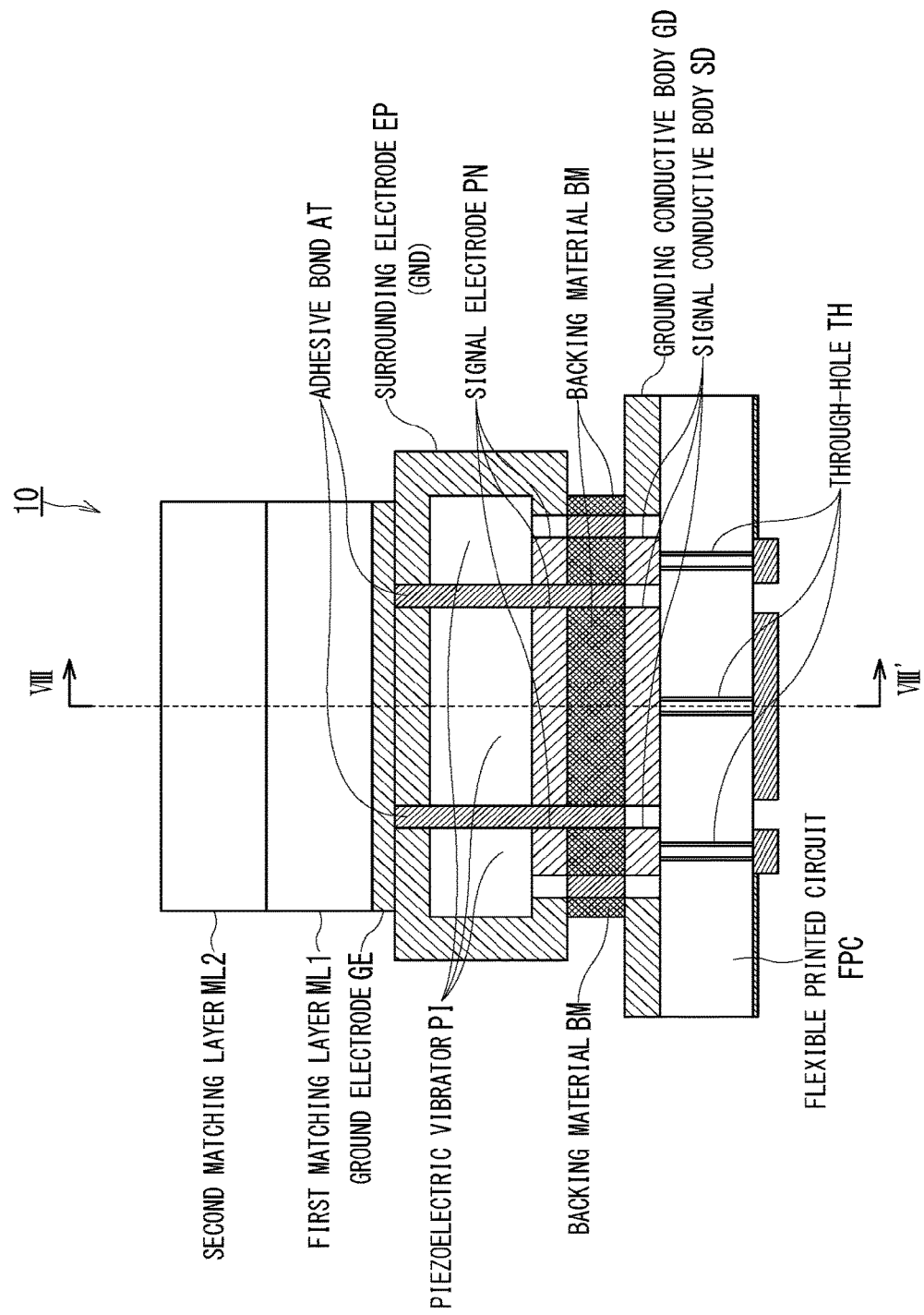
FIG. 7 is a schematic cross-sectional view illustrating the ultrasonic probe of the second embodiment when viewed from the azimuth direction.
Figure 8:
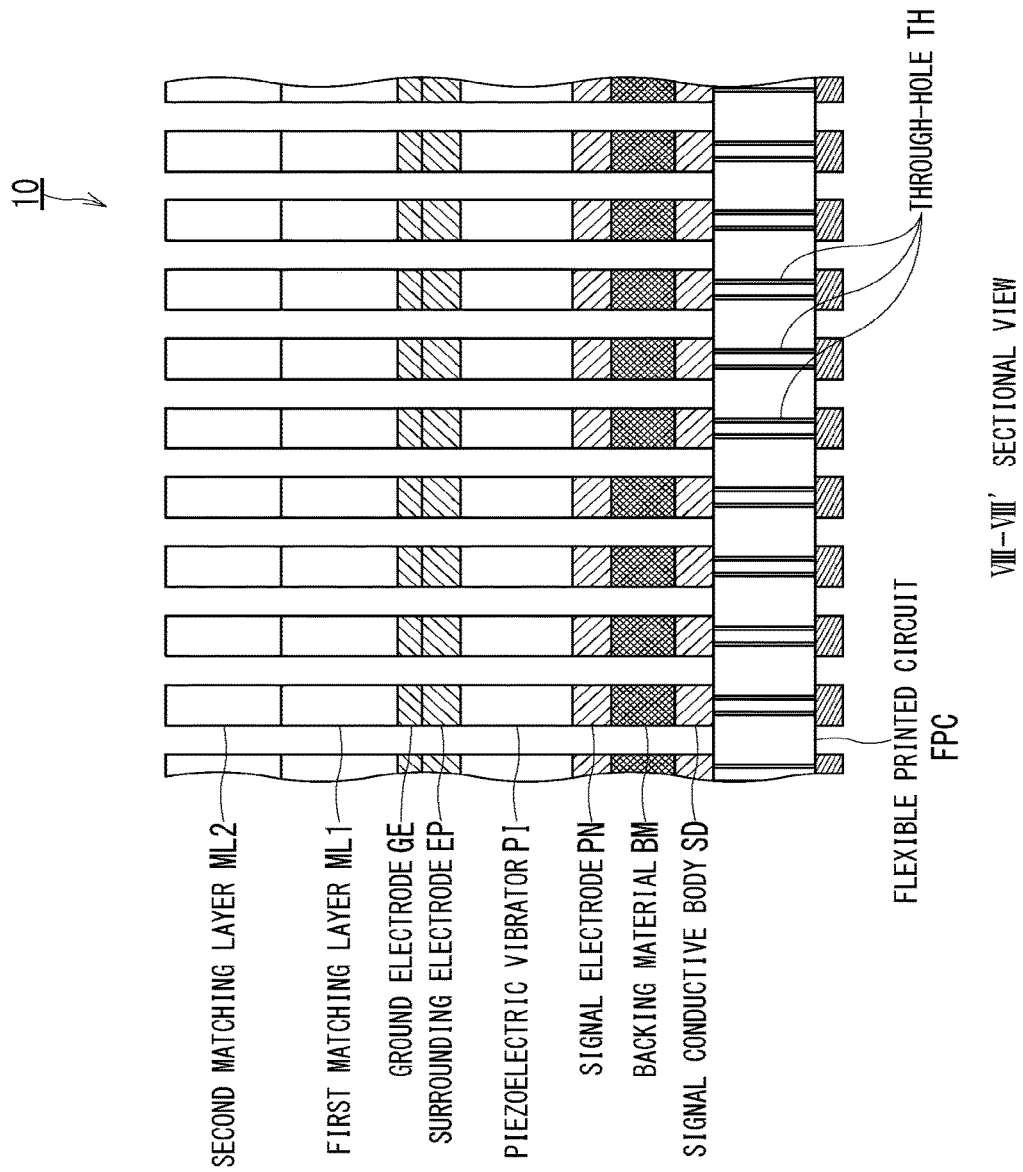
FIG. 8 is a schematic cross-sectional view through line VIII-VIII' of FIG. 7 illustrating the ultrasonic probe of the second embodiment when viewed from the elevation direction.

FIG. 7 is a schematic cross-sectional view illustrating the ultrasonic probe 10 of the second embodiment, when viewed from the azimuth direction. FIG. 8 is a schematic cross-sectional view through line VIII-VIII' of FIG. 7 illustrating the ultrasonic probe 10 of the second embodiment, when viewed from the elevation direction.

As shown in FIG. 7 and FIG. 8, in the ultrasonic probe 10 of the second embodiment, backing material BM is provided on the bottom surface of the piezoelectric vibrator PI (i.e., the surface opposite to the top surface where the first matching layer ML1 and the second matching layer ML2 are laminated).

The backing material BM is divided both in the azimuth direction and the elevation direction into a total of 42 parts together with the piezoelectric body. Each of the 42 parts of the divided backing material BM forms a piezoelectric element together with each of the 42 piezoelectric vibrators PI.

The backing material BM is made of, for instance, conductive material. The backing material BM has an effect of an acoustic absorption effect as well as an effect of reinforcing array of piezoelectric vibrators PI. Three parts of the divided backing material BM arrayed along the elevation direction may be bonded to each other with the adhesive bond AT.

According to at least one of the above-described embodiments, in an ultrasonic probe equipped with two-dimensionally arrayed piezoelectric vibrators like a 1.5D array type or a 2D array type, strength of piezoelectric elements can be highly maintained, and high quality and high reliability are also maintained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An ultrasonic probe in which a plurality of piezoelectric vibrators are arrayed in both of an azimuth direction and an elevation direction, the ultrasonic probe comprising:
    a piezoelectric body configured to have a piezoelectric effect, wherein the piezoelectric body is divided into plural parts in both of the azimuth direction and the elevation direction, in such a manner that each of the plural parts of the piezoelectric body forms each of the plurality of piezoelectric vibrators; and
    a matching layer configured to be laminated in an ultrasonic radiation direction of the piezoelectric body, wherein the matching layer is divided in the azimuth direction without being divided in the elevation direction;
    a printed circuit configured to extract respective signals of the plurality of piezoelectric vibrators;
    a surrounding electrode configured to be formed around the piezoelectric body so as to extend from an electrode, which is common to the plural piezoelectric vibrators on an ultrasonic radiation direction side, to an end of a surface of the piezoelectric body on a side opposite to the ultrasonic radiation direction side;
    a plurality of signal electrodes configured to be formed on the piezoelectric body and to be connected to respective piezoelectric vibrators;
    a grounding conductive body configured to be formed on an anterior surface of the printed circuit where the plurality of piezoelectric vibrators are arrayed and to be connected to the surrounding electrode; and
    a plurality of signal electrodes configured to be formed on the anterior surface and to be connected to the signal electrodes,
    wherein the printed circuit is further configured to
        be integrally bonded to the plural piezoelectric vibrators on the anterior surface, and
        be wired on a reverse surface of the printed circuit opposite to the anterior surface in such a manner that the respective signals of plural piezoelectric vibrators are separately extracted via the signal electrodes and through-holes, which are formed on the printed circuit and penetrate through the printed circuit.

2. The ultrasonic probe according to claim 1, further comprising backing material laminated on a surface of the piezoelectric body opposite to a surface where the matching layer is laminated, wherein the backing material is divided into plural sections in both of the azimuth direction and the elevation direction, in such a manner that each of the plural sections of the backing material forms each of the plurality of piezoelectric vibrators together with each of the plural parts of the piezoelectric body.

3. An ultrasonic probe comprising:

a piezoelectric body configured to have a piezoelectric effect;

a matching layer configured to be laminated in an ultrasonic radiation direction of the piezoelectric body;

a printed circuit configured to extract respective signals of a plurality of piezoelectric vibrators formed by dividing the piezoelectric body into plural parts;

a plurality of signal electrodes configured to be formed on an anterior surface of the printed circuit where the plurality of piezoelectric vibrators are arrayed;

a surrounding electrode configured to be formed around the piezoelectric body so as to cover the piezoelectric body in a cross-section perpendicular to an azimuth direction; and a grounding conductive body configured to be formed on the anterior surface and to be connected to the surrounding electrode; and a plurality of signal conductive bodies configured to be formed on the anterior surface and to be connected to the plurality of signal electrodes, wherein the printed circuit is further configured to be integrally bonded to the plurality of piezoelectric vibrators on the anterior surface, and be wired on a reverse side of the printed circuit which is opposite to the anterior surface, in such a manner that the respective signals of a plurality of piezoelectric vibrators are extracted via the plurality of signal electrodes and a plurality of through-holes which are formed on the printed circuit and penetrate through the printed circuit.

* * * * *